United States Patent
Harada et al.

(10) Patent No.: US 9,365,802 B2
(45) Date of Patent: Jun. 14, 2016

(54) CLEANING LIQUID FOR SEMICONDUCTOR DEVICE SUBSTRATES AND METHOD OF CLEANING SUBSTRATE FOR SEMICONDUCTOR DEVICES

(71) Applicant: MITSUBISHI CHEMICAL CORPORATION, Chiyoda-ku (JP)

(72) Inventors: Ken Harada, Fukuoka (JP); Atsushi Ito, Fukuoka (JP); Toshiyuki Suzuki, Fukuoka (JP)

(73) Assignee: MITSUBISHI CHEMICAL CORPORATION, Chiyoda-ku (JP)

( * ) Notice: Subject to any disclaimer, the term of this patent is extended or adjusted under 35 U.S.C. 154(b) by 562 days.

(21) Appl. No.: 13/780,544

(22) Filed: Feb. 28, 2013

(65) Prior Publication Data

US 2013/0174867 A1 Jul. 11, 2013

Related U.S. Application Data

(63) Continuation of application No. PCT/JP2011/069668, filed on Aug. 30, 2011.

(30) Foreign Application Priority Data

Aug. 31, 2010 (JP) ................. 2010-194429

(51) Int. Cl.
| | |
|---|---|
| C11D 1/37 | (2006.01) |
| C11D 1/04 | (2006.01) |
| C11D 1/12 | (2006.01) |
| C11D 3/20 | (2006.01) |
| C11D 3/37 | (2006.01) |
| C11D 11/00 | (2006.01) |
| H01L 21/02 | (2006.01) |

(52) U.S. Cl.
CPC .. C11D 1/37 (2013.01); C11D 1/04 (2013.01); C11D 1/12 (2013.01); C11D 3/2086 (2013.01); C11D 3/3765 (2013.01); C11D 11/0047 (2013.01); H01L 21/02074 (2013.01)

(58) Field of Classification Search
CPC ...... C11D 11/0047; C11D 1/02; C11D 3/042; C11D 3/3409; C11D 3/2086
See application file for complete search history.

(56) References Cited

U.S. PATENT DOCUMENTS

| | | | | |
|---|---|---|---|---|
| 5,462,697 A | * | 10/1995 | Yianakopoulos | .... C11D 3/0073 510/101 |
| 2003/0158059 A1 | * | 8/2003 | Sakai | .................. C11D 3/0042 510/175 |
| 2007/0167343 A1 | * | 7/2007 | Suzuki | ..................... C11D 1/04 510/329 |
| 2008/0173328 A1 | * | 7/2008 | Nishiwaki | ................. C11D 1/22 134/6 |
| 2009/0088361 A1 | * | 4/2009 | Nishiwaki | ............ C11D 3/2082 510/175 |
| 2010/0167535 A1 | * | 7/2010 | Nishiwaki | ............. C11D 3/2075 438/669 |
| 2010/0167547 A1 | * | 7/2010 | Kamimura | ............... C09G 1/02 438/693 |
| 2010/0167972 A1 | * | 7/2010 | Kawase | ............... C11D 3/2075 510/175 |
| 2011/0021400 A1 | * | 1/2011 | Mizuta | .................... G03F 7/425 510/176 |

FOREIGN PATENT DOCUMENTS

| | | |
|---|---|---|
| JP | 6-41770 A | 2/1994 |
| JP | 9-134899 A | 5/1997 |
| JP | 2000-319699 A | 11/2000 |
| JP | 2002-270566 | 9/2002 |
| JP | 2003-289060 | 10/2003 |
| JP | 2005-060660 | 3/2005 |
| JP | 2005-194294 | 7/2005 |
| JP | 4038069 | 11/2007 |
| JP | 2010-87258 A | 4/2010 |

OTHER PUBLICATIONS

U.S. Appl. No. 13/854,235, filed Apr. 1, 2013, Harada, et al.
U.S. Appl. No. 14/461,908, filed Aug. 18, 2014, Harada, et al.
Office Action issued Aug. 4, 2015 in Japanese Patent Application No. 2011-174022 (with unedited computer generated English translation).
International Search Report issued Dec. 6, 2011 in PCT/JP2011/069668 filed Aug. 30, 2011.
Taiwanese Office Action issued Sep. 2, 2015 in Patent Application No. 100131213 (with English Translation).
Japanese Office Action issued Feb. 17, 2016, in corresponding Japanese Patent Application No. 2011-174022 (with English-language Translation).

* cited by examiner

*Primary Examiner* — Gregory Webb

(74) *Attorney, Agent, or Firm* — Oblon, McClelland, Maier & Neustadt, L.L.P

(57) ABSTRACT

The invention relates to a cleaning liquid for semiconductor device substrates comprising the following components (A) to (D) and a method of cleaning semiconductor device substrates:

(A) at least either one of a polycarboxylic acid and a hydroxycarboxylic acid;
(B) a sulfonic acid type anionic surfactant;
(C) a carboxylic acid type anionic surfactant; and
(D) water.

12 Claims, No Drawings

CLEANING LIQUID FOR SEMICONDUCTOR DEVICE SUBSTRATES AND METHOD OF CLEANING SUBSTRATE FOR SEMICONDUCTOR DEVICES

TECHNICAL FIELD

The present invention relates to a cleaning liquid for effectively cleaning a surface of a substrate for semiconductor devices.

BACKGROUND ART

In semiconductor device production steps, new metallic materials having a low resistance value (Cu, etc.) and low-dielectric constant (low-k) materials are coming to be employed as wiring and interlayer insulating film, respectively, in order to attain increases in speed and integration degree in the devices.

A substrate for semiconductor devices is produced by first forming deposit layers including a metal film and an interlayer insulating film on a silicon wafer substrate, subsequently subjecting the wafer substrate to chemical mechanical polishing (hereinafter referred to as "CMP") to conduct surface planarization, and stacking new layers on the planarized surface. In the substrate for semiconductor devices, each layer must be highly precisely planar.

On the surface of the semiconductor device substrate which has undergone the CMP step, various foreign matters remain. For example, the foreign matters include dust particles resulting from the polishing of the metallic wiring or low-dielectric constant film, colloidal silica contained in the slurry used in the CMP step, and organic residues derived from the anticorrosive contained in the slurry. For producing a semiconductor device having a multilayer structure, it is essential to remove such foreign matters. However, there are problems such as the following. The low-dielectric constant film is difficult to clean because the low-dielectric constant film is hydrophobic, has a low affinity for water, and repels the cleaning liquid. Furthermore, the colloidal silica is as extremely small as 100 nm or below and hence is difficult to remove. Although the organic residues can be dissolved away or decomposed, use of a cleaning liquid which has high dissolving or decomposing ability corrodes the metallic wiring. In order to overcome these problems, application of various cleaning techniques is being attempted.

A most important technique among these is to control zeta potential. It is known that in acidic water, the surface of a semiconductor device substrate into which copper wiring has been introduced is negatively charged. Meanwhile, it is known that the colloidal silica contained in the slurry which is in use in the CMP step is positively charged in acidic water. In the case where the cleaning liquid contains no anionic surfactant, the fine colloidal silica particles which have been positively charged are apt to adhere to the negatively charged surface of the semiconductor device substrate in the substrate cleaning step that is conducted subsequently to the CMP step. For preventing this adhesion, it is necessary to control the zeta potential of the colloidal silica so as to be negative.

In addition, the substrate cleaning step, which is conducted subsequently to the CMP step, is further required to be less apt to cause corrosion of the Cu wiring. Since the degree of integration in devices is becoming higher and the Cu wiring is becoming thinner especially in recent years, there are cases where even slight corrosion which was not problematic in conventional devices can be a cause of a decrease in yield.

In order to overcome such a problem, application of various cleaning techniques is being attempted.

For example, in patent document 1, a cleaning liquid obtained by adding an alkali or an organic acid to a specific surfactant and water is disclosed in order to remove fine particles and organic contaminants which have adhered to a substrate.

In patent document 2, a cleaning liquid which contains a nonionic surfactant, e.g., polyoxyethylene nonylphenyl ether, a compound that forms a complex with a metal, such as aminoacetic acid or quinaldinic acid and an alkali ingredient is disclosed.

In patent document 3, a cleaning liquid which contains only one carboxylic acid type anionic surfactant as the surfactant is disclosed.

In patent document 4, an alkaline cleaning liquid which contains a carboxylic acid type anionic surfactant is disclosed.

BACKGROUND ART DOCUMENT

Patent Document

Patent Document 1: JP-A-2003-289060
Patent Document 2: JP-A-2002-270566
Patent Document 3: JP-A-2005-194294
Patent Document 4: Japanese Patent No. 4038069

SUMMARY OF INVENTION

Problem that Invention is to Solve

Various methods of cleaning with those cleaning liquids have been proposed as techniques for use in semiconductor device production steps. However, the conventional art techniques have had problems, for example, that the substrate-cleaning effect of the cleaning liquid is insufficient, that the cleaning liquid corrodes the substrate surface (in particular, the metallic wiring), and that the cleaning liquid is less apt to be removed in the step of rinsing with ultrapure water, resulting in the necessity of a prolonged rinsing period, which constitutes an obstacle to a reduction in cleaning period.

There has been no technique capable of sufficiently removing, in a short period, various contaminants present on the surface of, in particular, a hydrophobic low-dielectric constant insulating film or highly corrodible Cu wiring. There has been a need for establishing such technique.

An object of the invention, which has been accomplished in order to eliminate the problems described above, is to provide a cleaning liquid for semiconductor device substrates which is capable of simultaneously removing contaminants due to fine-particle adhesion, organic contaminants and metallic contaminants without corroding the substrate surface, and which has satisfactory water rinsability and can highly clean the substrate surface in a short period.

Means for Solving Problem

The present inventors thought that for effectively removing contaminants present on the surface of a hydrophobic low-dielectric constant insulating film, it is important to improve the wettability of the hydrophobic surface by utilizing a surfactant, and diligently made investigations in order to overcome the problems described above. As a result, the inventors have found that those problems can be eliminated when a solution which contains specific surfactants is used as a cleaning liquid. The invention has been thus accomplished.

The present invention relates to the following inventions.

<1> A cleaning liquid for semiconductor device substrates, comprising the following components (A) to (D):
(A) at least either one of a polycarboxylic acid and a hydroxycarboxylic acid;
(B) a sulfonic acid type anionic surfactant;
(C) a carboxylic acid type anionic surfactant; and
(D) water.

<2> The cleaning liquid for semiconductor device substrates as described in <1> above,
wherein component (A) is a compound that has two or more carboxyl groups and one or more hydroxy groups.

<3> The cleaning liquid for semiconductor device substrates as described in <1> or <2> above,
wherein component (A) is a compound having 2 to 10 carbon atoms.

<4> The cleaning liquid for semiconductor device substrates as described in <1> or <3> above,
wherein component (A) is at least one member selected from the group consisting of citric acid, tartaric acid, malic acid and lactic acid.

<5> The cleaning liquid for semiconductor device substrates as described in any one of <1> to <4> above,
wherein component (B) is at least one member selected from the group consisting of alkylsulfonic acids and salts thereof, alkylbenzenesulfonic acids and salts thereof, alkyldiphenyl ether disulfonic acids and salts thereof, alkylmethyltauric acids and salts thereof, and sulfosuccinic acid diesters and salts thereof.

<6> The cleaning liquid for semiconductor device substrates as described in any one of <1> to <5> above,
wherein component (C) is either a compound represented by the following general formula (1) or a salt thereof:

$$R\text{—}O\text{-}(AO)_m\text{—}(CH_2)_n\text{—}COOH \qquad (1)$$

wherein in general formula (1), R is a linear or branched alkyl group having 5 to 20 carbon atoms;
AO is at least either one of an oxyethylene group and an oxypropylene group;
m is 3 to 30; and
n is 1 to 6.

<7> The cleaning liquid for semiconductor device substrates as described in any one of <1> to <6> above,
wherein a content of component (A) is 5 to 30% by mass, a content of component (B) is 0.01 to 10% by mass, and a content of component (C) is 0.01 to 10% by mass.

<8> The cleaning liquid for semiconductor device substrates as described in any one of <1> to <6> above,
wherein a content of component (A) is 0.03 to 3% by mass, a content of component (B) is 0.0001 to 1% by mass, and a content of component (C) is 0.0001 to 1% by mass.

<9> The cleaning liquid for semiconductor device substrates as described in any one of <1> to <8> above,
wherein a mass ratio of component (B) and component (C) [component (B)/component (C)] is in a range of 1/15 to 1.5/1.

<10> The cleaning liquid for semiconductor device substrates as described in any one of <1> to <9> above,
wherein colloidal silica having a primary-particle diameter of 80 nm has a zeta potential of −30 mV or lower as measured in a cleaning liquid which has been diluted to a water/cleaning liquid ratio of 40 by mass.

<11> A method of cleaning a substrate for semiconductor devices, comprising:
a step of cleaning the substrate for semiconductor devices by using the cleaning liquid for semiconductor device substrates as described in any one of <1> to <10> above.

<12> The method of cleaning a substrate for semiconductor devices as described in <11> above,
wherein the substrate for semiconductor devices has Cu wiring and a low-dielectric constant insulating film on a substrate surface, and
the substrate for semiconductor devices that has been subjected to chemical mechanical polishing is cleaned.

Effects of Invention

According to the invention, a cleaning liquid for semiconductor device substrates is provided with which it is possible, in the cleaning of a substrate for semiconductor devices, to simultaneously remove the fine particles, organic contaminants and metallic contaminants which are adherent to the substrate, without corroding the substrate surface, and which has satisfactory water rinsability.

MODE FOR CARRYING OUT INVENTION

The present invention is explained below in detail.
In the invention, "% by mass" has the same meaning as "% by weight".
The invention relates to a cleaning liquid for semiconductor device substrates which includes the following components (A) to (D):
(A) at least either one of a polycarboxylic acid and a hydroxycarboxylic acid,
(B) a sulfonic acid type anionic surfactant,
(C) a carboxylic acid type anionic surfactant, and
(D) water.

In the invention, component (A) is at least one compound selected from the group consisting of polycarboxylic acids and hydroxycarboxylic acids. The polycarboxylic acids are compounds each having two or more carboxyl groups in the molecule, and the hydroxycarboxylic acids are compounds each having one or more hydroxy groups and one or more carboxyl groups in the molecule.

Preferred of these are compounds each having two or more carboxyl groups and one or more hydroxy groups in the molecule.

The number of carbon atoms of such a compound to be used as component (A) is preferably 2 to 10, more preferably 3 to 8, especially preferably 3 to 6, because compounds having a relatively small number of carbon atoms are easy to procure and handle.

Suitable examples of compounds for use as component (A) include oxalic acid, citric acid, tartaric acid, malic acid and lactic acid. Citric acid is especially preferred.

One of those compounds usable as component (A) may be used alone, or two or more thereof may be used in combination in any desired proportion.

Furthermore, a compound (A) in which the carboxyl groups have been partly converted to a salt may be used unless use of this compound lessens the effects of the invention.

As component (B), i.e., a sulfonic acid type anionic surfactant, use can be made of any anionic surfactant having a sulfo group (—SO$_3$H). However, preferred are alkylsulfonic acids and salts thereof, alkylbenzenesulfonic acids and salts thereof, alkyldiphenyl ether disulfonic acids and salts thereof, alkylmethyltauric acids and salts thereof, and sulfosuccinic acid diesters and salts thereof.

More preferred examples thereof include dodecylbenzenesulfonic acid, dodecanesulfonic acid and alkali metal salts of these acids.

Of these, dodecylbenzenesulfonic acid and alkali metal salts thereof are suitable from the standpoints of quality stability and availability.

One of such compounds may be used alone as component (B), or two or more of such compounds may be used as component (B) in any desired proportion.

Component (C), i.e., a carboxylic acid type anionic surfactant, is a compound which has a carboxyl group as a hydrophilic portion and has a hydrocarbon group having 5 or more carbon atoms as a hydrophobic portion. Besides the hydrophilic portion and the hydrophobic portion, there may be a portion which links the two portions, such as, for example, an oxyethylene group, an oxypropylene group, or a group made up of a plurality of such groups connected to each other.

Suitable among such compounds is a compound represented by the following general formula (1) or a salt thereof.

$$R\text{—}O\text{-}(AO)_m\text{—}(CH_2)_n\text{—}COOH \qquad (1)$$

(In general formula (1), R is a linear or branched alkyl group having 5 to 20 carbon atoms. AO represents an oxyethylene group and/or an oxypropylene group. Symbol m is 3 to 30, and n is 1 to 6.)

In general formula (1), the number of carbon atoms of R is preferably 5 to 15, more preferably 8 to 15, especially preferably 10 to 13. Symbol m is preferably 4 to 20, more preferably 4.5 to 10. Symbol n is preferably 1 to 3. There are cases where the compound represented by general formula (1) is present as a mixture of compounds which differ in the number of repeating units from molecule to molecule, and m therefore represents an average number for the whole.

Specific examples of the compound represented by general formula (1) include polyoxyethylene lauryl ether acetic acid, polyoxyethylene tridecyl ether acetic acid and polyoxyethylene alkyl ether acetic acids.

By further adding a carboxylic acid type anionic surfactant as component (C) to a cleaning liquid which contains component (A) and component (B), a considerable decrease in zeta potential is caused. A considerable decrease in zeta potential is caused when the cleaning liquid contains both component (B) and component (C), and a sufficient decrease in zeta potential does not occur in a cleaning liquid which contains either component (B) or component (C) alone.

The decrease in zeta potential results in electrical repulsion between fine particles, such as the colloidal silica contained in the slurry used in the CMP step, and the surface of the semiconductor device substrate. When this electrical repulsion occurs, fine particles such as colloidal silica becomes less apt to adhere to the surface of the semiconductor device substrate.

One of those compounds may be used alone as component (C), or two or more of the compounds may be used as component (C) in any desired proportion.

The water used as component (D) is the solvent of the cleaning liquid of the invention. It is preferred that the water to be used as a solvent should be either deionized water in which the content of impurities has been minimized or ultrapure water. Component (D) may contain a solvent other than water, such as, for example, ethanol, so long as the inclusion thereof does not lessen the effects of the invention.

Also with respect to components (A) to (C) and other additives, it is preferred to use purified ingredients according to need.

Processes for producing the cleaning liquid of the invention are not particularly limited, and the cleaning liquid may be produced by a conventionally known process. For example, the cleaning liquid can be produced by mixing ingredients for constituting the cleaning liquid (components (A) to (D) and other ingredients employed according to need).

The sequence of mixing also is not limited unless the mixing poses a particular problem such as, for example, reaction or precipitation. Use may be made of a method in which any two or more of the ingredients for constituting the cleaning liquid are mixed beforehand and the remaining ingredients are thereafter mixed therewith. Alternatively, all the ingredients may be mixed together at a time.

The cleaning liquid of the invention may be directly produced while regulating the concentrations of components (A) to (C) so as to be suitable for cleaning. However, there are often cases where a cleaning liquid which contains the components in high concentrations (hereinafter often referred to as "cleaning liquid concentrate") is first produced and is thereafter diluted with water as component (D) and used, from the standpoint of reducing the cost of transportation and storage.

There are no particular limitations on the concentration of each component in this cleaning liquid concentrate. It is, however, preferred that the concentration thereof should be within such a range that none of components (A) to (C), other ingredients added according to need, and any product of reaction between these ingredients separates out or precipitates in the cleaning liquid concentrate.

Such preferred concentration ranges are 5 to 30% by mass for component (A), 0.01 to 10% by mass for component (B), and 0.01 to 10% by mass for component (C). When the concentrations thereof are within such ranges, the components contained in the concentrate are less apt to separate out during transportation or storage and, by adding water thereto, the concentrate can be easily rendered usable as a suitable cleaning liquid having concentrations suitable for cleaning.

The concentration of each component during cleaning of a substrate for semiconductor devices is suitably determined according to the semiconductor device substrate to be cleaned.

The concentration of component (A), when the solution is used as a cleaning liquid, is generally 0.03 to 3% by mass, preferably 0.05 to 3% by mass, more preferably 0.06 to 1% by mass.

In case where the concentration of component (A) is less than 0.05% by mass, there is a possibility that contaminant removal from the substrate for semiconductor devices might be insufficient. Even when the concentration thereof exceeds 3% by mass, not only the effect thereof is not enhanced any more but also the removal of the cleaning liquid by water rinsing after the cleaning is costly. In addition, when the concentration of component (A) exceeds 3% by mass, there are cases where this cleaning liquid arouses a trouble that copper wiring corrosion occurs.

Component (B) and component (C), which are surfactants, especially contribute to the removal of fine particles adherent to the substrate for semiconductor devices.

The concentration of component (B), when the solution is used as a cleaning liquid, is generally 0.0001 to 1% by mass, preferably 0.0001 to 0.3% by mass. The concentration of component (C) is generally 0.0001 to 1% by mass, preferably 0.0001 to 0.3% by mass.

In case where the concentration of component (B) and/or component (C) is too low, there is a possibility that the fine particles adherent to the substrate for semiconductor devices cannot be sufficiently removed. Conversely, even when the concentration thereof is too high, not only an improvement in effect which compensates for the concentration is not obtained but also use of this cleaning liquid results in excessive frothing and in an increase in the burden of waste liquid treatment.

Since the insulating film layer exposed in the surface of the semiconductor device substrate is hydrophobic, sufficient cleaning is impossible with a cleaning liquid which contains no surfactant, because this cleaning liquid has a low affinity for the surface of the insulating film layer. However, in the case of the cleaning liquid which contains surfactants, droplets of this cleaning liquid dropped onto the insulating film have a reduced contact angle, and an improvement in cleaning effect can be expected.

Furthermore, the cleaning liquid which contains component (C) added thereto has been ascertained to bring about a decrease in Cu film etching rate when examined after having been diluted to a water/cleaning liquid mass ratio of 40. It is thought that this cleaning liquid is less corrosive to the Cu thin-line part.

From the standpoint of sufficiently obtaining the ability to remove fine-particle contaminants, the mass ratio of component (B) and component (C) [component (B)/component (C)] is preferably in the range of 1/15 to 1.5/1, more preferably in the range of 1/10 to 1/1.

In case where the cleaning liquid contains component (B) only, there is a problem that adhesion of fine particles cannot be sufficiently prevented and adherent fine particles cannot be sufficiently removed. In case where the cleaning liquid contains component (C) only, there is a problem that this cleaning liquid has an insufficient cleaning effect and does not bring about a sufficient reduction in zeta potential. However, since the cleaning liquid of the invention contains the two kinds of anionic surfactants, i.e., component (B) and component (C), this cleaning liquid has the advantage of causing a considerable decrease in zeta potential as compared with cleaning liquids which contain either one of the anionic surfactants alone respectively.

When the mass ratio [component (B)/component (C)] is below 1/15 or exceeds 1.5/1, there are cases where a sufficient decrease in zeta potential does not occur.

As stated above, the cleaning liquid to be subjected to cleaning may be produced by diluting a cleaning liquid concentrate so that the concentration of each component becomes suitable for the semiconductor device substrate to be cleaned, or may be directly produced while regulating the concentration of each component to such concentration.

In the cleaning liquid of the invention, colloidal silica having a primary-particle diameter of 80 nm has a zeta potential of preferably −30 mV or lower, more preferably −40 mV or lower, as measured in the cleaning liquid which has been diluted to a water/cleaning liquid ratio of 40 by mass. By using the cleaning liquid in which the colloidal silica has a negative value of zeta potential, fine particles such as, for example, colloidal silica can be prevented from adhering to the surface of the semiconductor device substrate. The cleaning liquid of the invention employs two kinds of anionic surfactants, i.e., component (B) and component (C), in combination, and has thereby attained a remarkable decrease in zeta potential and an improvement in cleaning effect.

Incidentally, the colloidal silica to be used is spherical one. The primary-particle diameter thereof can be determined through an examination with an electron microscope. As such colloidal silica, use may be made, for example, of "Cataloid S" Series, manufactured by JGC Catalysts and Chemicals Ltd.

In case where the zeta potential measured under those conditions is higher than −30 my, there are cases where electrostatic repulsion does not occur sufficiently between the semiconductor device substrate and colloidal silica and it is impossible to sufficiently prevent fine colloidal silica particles from adhering to the semiconductor device substrate.

It is preferred that the cleaning liquid of the invention has a pH of 5 or less in terms of the pH of the cleaning liquid which is being used (diluted cleaning liquid). The pH thereof is more preferably 1 to 4, especially preferably 1 to 3.

In case where the pH thereof exceeds 5, the cleaning effect of component (A) is apt to be insufficient. The lower the pH thereof, the more the cleaning liquid is advantageous from the standpoint of cleaning. However, in case where the pH thereof is less than 1, there is the possibility of posing a problem concerning substrate corrosion.

pH regulation can be attained by selecting the kinds and amounts of components (A) to (C) and adding an ingredient which functions as a pH regulator, such as, for example, a quaternary ammonium hydroxide (e.g., tetramethylammonium hydroxide).

The cleaning liquid of the invention may contain other ingredients in any desired proportions so long as the inclusion thereof does not impair the performance of the cleaning liquid.

Examples of the other ingredients include:

anticorrosives such as monovalent carboxylic acids such as acetic acid and propionic acid, sulfur-containing organic compounds such as 2-mercaptothiazoline, 2-mercaptoimidazoline, 2-mercaptoethanol and thioglycerol, nitrogen-containing organic compounds such as benzotriazole, 3-aminotriazole, $N(R^2)_3$ (the $R^2$ groups are alkyl groups having 1 to 4 carbon atoms and/or hydroxyalkyl groups having 1 to 4 carbon atoms and may be the same or different), urea and thiourea, water-soluble polymers such as polyethylene glycol and polyvinyl alcohol, and alkylalcohol compounds such as $R^3OH$ ($R^3$ is an alkyl group having 1 to 4 carbon atoms);

etching accelerators which are expected to produce the effect of removing polymers and the like that are tenaciously adherent after dry etching, such as dissolved gases such as hydrogen, argon, nitrogen, carbon dioxide and ammonia, and hydrofluoric acid, ammonium fluoride, and BHF (buffered hydrofluoric acid);

reducing agents such as hydrazine;

oxidizing agents such as hydrogen peroxide, ozone and oxygen; and alkanolamines such as monoethanolamine, diethanolamine and triethanolamine.

Incidentally, there are cases where the semiconductor device substrate to be cleaned has, as wiring, an exposed metallic material, e.g., Cu, that reacts with hydrogen peroxide and dissolves. It is preferred that the cleaning liquid to be used for cleaning in this case should contain substantially no hydrogen peroxide.

The cleaning method of the invention is explained next.

The cleaning method of the invention is carried out by a method in which the cleaning liquid of the invention described above is brought into direct contact with a substrate for semiconductor devices.

Examples of the semiconductor device substrate to be cleaned include various semiconductor device substrates such as semiconductors, glasses, metals, ceramics, resins, magnetic materials and superconductors.

The cleaning liquid of the invention is especially suitable for a semiconductor device substrate, among those substrates, that has a metal or metal compound as wiring or the like in the surface thereof, because this cleaning liquid does not corrode the metal surface and can be removed by short-time rinsing.

Examples of the metal used in the semiconductor device substrate include W, Cu, Ti, Cr, Co, Zr, Hf, Mo, Ru, Au, Pt and Ag, and examples of the metal compound include nitrides, oxides and silicides of these metals. Of these, Cu and Cu-containing compounds are preferred.

Furthermore, since the cleaning method of the invention produces a high cleaning effect even on low-dielectric constant insulating materials having high hydrophobicity, this cleaning method is suitable also for semiconductor device substrates having a low-dielectric constant insulating material.

Examples of such low-dielectric constant materials include organic polymer materials such as polyimides, BCB (benzocyclobutene), Flare (Honeywell Inc.), and SiLK (Dow Chemical Co.), inorganic polymer materials such as FSG (fluorinated silicate glass) and SiOC type materials such as BLACK DIAMOND (Applied Materials Inc.) and Aurora (ASM Japan K.K.).

The cleaning method of the invention is especially suitable for application to the case where the semiconductor device substrate has Cu wiring and a low-dielectric constant insulating film on the substrate surface and this semiconductor device substrate is cleaned after having being subjected to CMP. In the CMP step, the substrate is polished with a polishing agent while rubbing the substrate against a pad.

The polishing agent includes abrasive particles such as colloidal silica ($SiO_2$), fumed silica ($SiO_2$), alumina ($Al_2O_3$) or ceria ($CeO_2$). Although such abrasive particles are a main cause of fine-particle contamination of the semiconductor device substrate, the cleaning liquid of the invention is highly effective against fine-particle contamination because this cleaning liquid has the functions of dispersing the fine particles adherent to the substrate in the cleaning liquid and preventing the dispersed fine particles from adhering again.

There are cases where the polishing agent contains additives other than abrasive particles, such as, for example, an oxidizing agent and a dispersant.

Especially in the CMP of a semiconductor device substrate which has a Cu film as metallic wiring in the surface thereof, an anticorrosive is often added because the Cu film is apt to be corroded.

As the anticorrosive, it is preferred to use an azole-based anticorrosive having a high anticorrosive effect. More specifically, examples thereof include diazole, triazole and tetrazole which are heterocycles that contain nitrogen alone as the heteroatoms, oxazole, isoxazole and oxadiazole which are heterocycles that contain nitrogen and oxygen as the heteroatoms, and thiazole, isothiazole and thiadiazole which are heterocycles that contain nitrogen and sulfur as the heteroatoms. Especially preferred of these is a benzotriazole (BTA)-based anticorrosive, which has an excellent anticorrosive effect.

The cleaning liquid of the invention is excellent in that when applied to a surface which has been polished with a polishing agent containing such anticorrosives, the cleaning liquid can highly effectively remove contaminants attributable to the anticorrosives.

Namely, when such an anticorrosive is present in the polishing agent, the anticorrosive inhibits the Cu film surface from being corroded but reacts with Cu ions which have dissolved out during the polishing and thereby generates an insoluble deposit in a large amount. The cleaning liquid of the invention can efficiently dissolve and remove such insoluble deposits. In addition, the surfactants, which are apt to remain on the metal surface, can be removed by short-time rinsing. An improvement in throughput is hence possible.

Consequently, the cleaning method of the invention is suitable for the cleaning of a semiconductor device substrate which has a surface where a Cu film and a low-dielectric constant insulating film coexist and which has undergone CMP. In particular, this cleaning method is suitable for the cleaning of the semiconductor device substrate which has undergone CMP with a polishing agent containing an azole-based anticorrosive.

As stated above, the cleaning method of the invention is carried out by a method in which the cleaning liquid of the invention is brought into direct contact with a substrate for semiconductor devices. A cleaning liquid having suitable component concentrations is selected in accordance with the kind of the semiconductor device substrate to be cleaned.

For example, in the case where the semiconductor device substrate to be cleaned is a substrate which has Cu wiring and a low-dielectric constant insulating film in the substrate surface, suitable concentration ranges for the components are as follows. The concentration of component (A) is generally 0.03 to 3% by mass, preferably 0.05 to 3% by mass, more preferably 0.06 to 1% by mass; the concentration of component (B) is generally 0.0001 to 1% by mass, preferably 0.0001 to 0.3% by mass; and the concentration of component (C) is generally 0.0001 to 1% by mass, preferably 0.0001 to 0.3% by mass.

Examples of methods for bringing the cleaning liquid into contact with the substrate include a dipping method in which a cleaning tank is filled with the cleaning liquid and the substrate is dipped therein, a spinning method in which the substrate is rotated at a high speed while causing the cleaning liquid to flow onto the substrate from a nozzle, and a spraying method in which the liquid is sprayed on the substrate to clean the substrate. Examples of apparatus for conducting such cleaning include a batch cleaning apparatus in which a plurality of substrates held in a cassette are simultaneously cleaned and a sheet-by-sheet cleaning apparatus in which one substrate is attached to a holder and cleaned.

Although the cleaning liquid of the invention is applicable to any of those methods, it is preferred to use the cleaning liquid in cleaning by the spinning method or spraying method from the standpoint that contaminants can be more efficiently removed in a short period. When the cleaning liquid of the invention is applied to a sheet-by-sheet cleaning apparatus, in which a reduction in cleaning period and a reduction in cleaning liquid use amount are desired, these problems are eliminated. Use of the cleaning liquid in this apparatus is hence preferred.

When the cleaning method of the invention is conducted in combination with a method of cleaning based on physical force, in particular, with scrubbing with a cleaning brush or ultrasonic cleaning conducted at a frequency of 0.5 MHz or higher, the ability to eliminate the contamination due to fine particles adherent to the substrate is improved and this leads to a reduction in cleaning period. Use of this combination is hence preferred. Especially in cleaning after a CMP step, it is preferred to conduct scrubbing with a resinous brush. Although the material of the resinous brush can be selected at will, it is preferred to use, for example, PVA (polyvinyl alcohol).

Furthermore, rinsing with water may be conducted before and/or after the cleaning performed by the cleaning method of the invention.

In the cleaning method of the invention, the temperature of the cleaning liquid may usually be room temperature. However, the cleaning liquid may be heated to about 40 to 70° C. so long as this heating does not impair the performance thereof.

EXAMPLES

The invention will be explained below in more detail by reference to Examples, but the invention should not be construed as being limited to the following Examples unless the invention departs from the spirit thereof The reagents used for producing the cleaning liquids of the Examples and Comparative Examples are as follows.

"Reagents"

Component (A): (A) at least either one of polycarboxylic acid and hydroxycarboxylic acid Citric acid (special-grade reagent; manufactured by Wako Pure Chemical Ltd.)

Component (B): sulfonic acid type anionic surfactant

Dodecylbenzenesulfonic acid (manufactured by Lion Corp.) (abbreviation: DBS)

Component (C): carboxylic acid type anionic surfactant

Polyoxyethylene alkyl ether acetic acid

Nikko Chemicals Co., Ltd.: NIKKOL ECT-7 (abbreviation: ECT-7)

Nikko Chemicals Co., Ltd.: AKYPO RLM-100 (abbreviation: RLM-100)

Component (C'): carboxylic acid type nonionic surfactant

Polyoxyethylene alkyl ether

Lion Corp.: Leocol TDA-400-75 (abbreviation: TDA-400-75)

Other ingredient

Tetramethylammonium hydroxide (special-grade reagent; manufactured by Wako Pure Chemical Ltd.) (abbreviation: TMAH)

Chemical structural formulae of ECT-7, RLM-100 and TDA-400-75, which were shown above as component (C) or component (C'), are shown below.

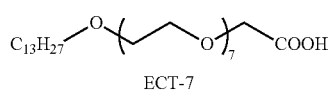

[Chem. 1]

ECT-7

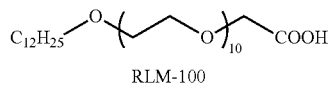

[Chem. 2]

RLM-100

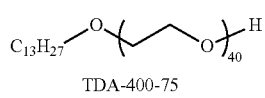

[Chem. 3]

TDA-400-75

Example 1

Preparation of Cleaning Liquid

Citric acid as component (A), DBS as component (B) and ECT-7 as component (C) were mixed with water as component (D) to prepare a semiconductor-substrate cleaning liquid concentrate of Example 1 which had the composition shown in Table 1. Subsequently, water was added to the cleaning liquid concentrate to dilute the concentrate 40 times, thereby preparing a semiconductor-substrate cleaning liquid (diluted solution). The compositions of the cleaning liquid concentrate and diluted solution are shown in Table 1.

(Measurement of Zeta Potential)

Colloidal silica (Cataloid SI-80P, manufactured by JGC Catalysts and Chemicals Ltd.; primary-particle diameter, 80 nm) was added to the cleaning liquid (diluted solution) so as to result in a concentration of the colloidal silica of 0.008% by mass. This cleaning liquid (diluted solution) was stirred for 1 hour or longer using a magnetic stirrer, and a measurement was thereafter conducted using a zeta potential analyzer (ELS-6000; Otsuka Electronics Co., Ltd.). The measurement was made three times, and an average for these measurements is shown as measurement results in Table 2.

(pH Measurement)

While the cleaning liquid (diluted solution) was being stirred using a magnetic stirrer, the pH of the solution was measured with a pH meter (D-24; Horiba Ltd.). The temperature of the test sample was kept at 25° C. in a thermostatic bath. The results of the measurement are shown in Table 2.

(Contact Angle)

Substrate BD2X (commercial product) was pretreated in the following manner. The substrate was cut into a size having a width of about 1 cm and a length of about 10 cm. In order to remove organic substances adherent to the surface of this BD2X substrate, the substrate was immersed in 1% by mass ammonia water (EL Grade; Mitsubishi Chemical Corp.) for 1 minute, subsequently rinsed sufficiently with ultrapure water, and dried by air blowing. An about 2.5-μL droplet of the cleaning liquid (diluted solution) was dropped onto the substrate which had undergone the pretreatment, and the contact angle between the droplet and the substrate was measured using a contact angle meter (DM700; Kyowa Interface Science Co., Ltd.). The measurement was made five times with respect to each cleaning liquid, and an average for these measurements is shown as measurement results in Table 2.

(Copper Substrate Etching Rate)

A copper seed substrate (commercial product) in which the film had been formed by PVD was cut into a 2.5-cm square. The thickness (nm) of the copper film of the cut substrate was measured with an X-ray fluorescence spectroscope (XRF) (RIX-3000; JEOL Ltd.). This copper substrate was immersed in the cleaning liquid (diluted solution) for 120 minutes. The substrate which had undergone the immersion was sufficiently rinsed with ultrapure water and dried by air blowing. Thereafter, the thickness (nm) of the copper film was measured again with the XRF. The etching rate was calculated using the following expression (1).

$$[(\text{Thickness before immersion (nm)})-(\text{thickness after immersion (nm)})]/120 \text{ minutes} \qquad (1)$$

The results of the measurement are shown in Table 2.

(Surface Roughness of Copper Substrate)

A copper seed substrate (commercial product) in which the film had been formed by PVD was cut into a 2.5-cm square. The cut substrate was immersed in the cleaning liquid (diluted solution) for 60 minutes, subsequently rinsed sufficiently with ultrapure water, and dried by air blowing. The substrate which had undergone the immersion was cut into three equal parts each having a width of about 8 mm, and a 1-μm square area in the surface of the substrate part which had been located at the center was scanned with an atomic force microscope (SPM-9600; Shimadzu Corp.). A value of roughness Rms was calculated by the least square method. The measurement was made on two areas located in different positions in the surface of the same substrate, and an average for these measurements is shown as measurement results in Table 2.

(Solubility of Cu-BTA)

A 1.53% by mass aqueous solution of copper acetate was mixed with a 1.0% by mass aqueous solution of benzotriazole (BTA) in a (1.53% by mass aqueous copper acetate solution)/(1.0% by mass aqueous BTA solution) mass ratio of 0.5 to prepare a 2.5% by mass aqueous solution of a Cu-BTA complex. A 100-μL portion of the 2.5% by mass aqueous Cu-BTA complex solution was added to the cleaning liquid (diluted solution), and the mixture was stirred for 10 minutes using a magnetic stirrer. Thereafter, the cleaning liquid was visually examined as to whether insoluble matter suspended in the cleaning liquid. When no insoluble matter was visually observed in the cleaning liquid (diluted solution), another 100-μL portion of the 2.5% by mass aqueous Cu-BTA complex solution was further added. The same addition operation was repeated until insoluble matter came to be visually observed in the cleaning liquid (diluted solution). When suspended matter was visually observed in the cleaning liquid (diluted solution), the concentration of the Cu-BTA complex which had been added was calculated. This concentration was taken as the solubility of Cu-BTA in the cleaning liquid. The higher the solubility of Cu-BTA, the higher the BTA-removing effect of the cleaning liquid. The results of the examination are shown in Table 2.

Example 2

Citric acid as component (A), DBS as component (B), and RLM-100 as component (C) were mixed with water as component (D) to prepare a semiconductor-substrate cleaning liquid concentrate of Example 2 which had the composition shown in Table 1. Subsequently, water was added to the cleaning liquid concentrate to dilute the concentrate 40 times, thereby preparing a semiconductor-substrate cleaning liquid (diluted solution). The compositions of the cleaning liquid concentrate and diluted solution are shown in Table 1.

Using the cleaning liquid obtained, each measurement was conducted in the same manner as in Example 1. The results of the measurements are shown in Table 2.

Example 3

Citric acid as component (A), DBS as component (B), ECT-7 as component (C), and acetic acid and TMAH as other ingredients were mixed with water as component (D) to prepare a semiconductor-substrate cleaning liquid concentrate of Example 3 which had the composition shown in Table 1. Subsequently, water was added to the cleaning liquid concentrate to dilute the concentrate 40 times, thereby preparing a semiconductor-substrate cleaning liquid (diluted solution). The compositions of the cleaning liquid concentrate and diluted solution are shown in Table 1.

Using the cleaning liquid obtained, each measurement was conducted in the same manner as in Example 1. The results of the measurements are shown in Table 2.

Example 4

Citric acid as component (A), DBS as component (B), ECT-7 as component (C), and acetic acid and TMAH as other ingredients were mixed with water as component (D) to prepare a semiconductor-substrate cleaning liquid concentrate of Example 4 which had the composition shown in Table 1. Subsequently, water was added to the cleaning liquid concentrate to dilute the concentrate 40 times, thereby preparing a semiconductor-substrate cleaning liquid (diluted solution). The compositions of the cleaning liquid concentrate and diluted solution are shown in Table 1.

Using the cleaning liquid obtained, each measurement was conducted in the same manner as in Example 1. The results of the measurements are shown in Table 2.

Comparative Example 1

Component (B) was omitted. Citric acid as component (A) and RLM-100 as component (C) were mixed with water as component (D) to prepare a semiconductor-substrate cleaning liquid concentrate of Comparative Example 1 which had the composition shown in Table 1. Subsequently, water was added to the cleaning liquid concentrate to dilute the concentrate 40 times, thereby preparing a semiconductor-substrate cleaning liquid (diluted solution). The compositions of the cleaning liquid concentrate and diluted solution are shown in Table 1.

Using the cleaning liquid obtained, each measurement was conducted in the same manner as in Example 1. The results of the measurements are shown in Table 2.

Comparative Example 2

Component (C) was omitted. Citric acid as component (A), DBS as component (B), and acetic acid and TMAH as other ingredients were mixed with water as component (D) to prepare a semiconductor-substrate cleaning liquid concentrate of Comparative Example 2 which had the composition shown in Table 1. Subsequently, water was added to the cleaning liquid concentrate to dilute the concentrate 40 times, thereby preparing a semiconductor-substrate cleaning liquid (diluted solution). The compositions of the cleaning liquid concentrate and diluted solution are shown in Table 1.

Using the cleaning liquid obtained, each measurement was conducted in the same manner as in Example 1. The results of the measurements are shown in Table 2.

Comparative Example 3

Component (C) was omitted. Citric acid as component (A), DBS as component (B), and acetic acid and TMAH as other ingredients were mixed with water as component (D) to prepare a semiconductor-substrate cleaning liquid concentrate of Comparative Example 3 which had the composition shown in Table 1. Subsequently, water was added to the cleaning liquid concentrate to dilute the concentrate 40 times, thereby preparing a semiconductor-substrate cleaning liquid (diluted solution). The compositions of the cleaning liquid concentrate and diluted solution are shown in Table 1.

Using the cleaning liquid obtained, each measurement was conducted in the same manner as in Example 1. The results of the measurements are shown in Table 2.

Comparative Example 4

TDA-400-75, which is a carboxylic acid type nonionic surfactant, used as component (C') in place of component (C), citric acid as component (A), and DBS as component (B) were mixed with water as component (D) to prepare a semiconductor-substrate cleaning liquid concentrate of Comparative Example 4 which had the composition shown in Table 1. Subsequently, water was added to the cleaning liquid concentrate to dilute the concentrate 40 times, thereby preparing a semiconductor-substrate cleaning liquid (diluted solution). The compositions of the cleaning liquid concentrate and diluted solution are shown in Table 1.

Using the cleaning liquid obtained, each measurement was conducted in the same manner as in Example 1. The results of the measurements are shown in Table 2.

Comparative Example 5

Component (C) was omitted. Citric acid as component (A) and DBS as component (B) were mixed with water as component (D) to prepare a semiconductor-substrate cleaning liquid concentrate of Comparative Example 5 which had the composition shown in Table 1. Subsequently, water was added to the cleaning liquid concentrate to dilute the concentrate 40 times, thereby preparing a semiconductor-substrate cleaning liquid (diluted solution). The compositions of the cleaning liquid concentrate and diluted solution are shown in Table 1.

Using the cleaning liquid obtained, each measurement was conducted in the same manner as in Example 1. The results of the measurements are shown in Table 2.

TABLE 1

| | Composition of cleaning liquid (mass %) | | | | | | | | | | | |
|---|---|---|---|---|---|---|---|---|---|---|---|---|
| | Component (A): citric acid | | Component (B): DBS | | Component (C): | | | Other ingredient | | | Other ingredient | |
| | Concentrate | Diluted solution | Concentrate | Diluted solution | Kind | Concentrate | Diluted solution | Kind | Concentrate | Diluted solution | Kind | Concentrate | Diluted solution |
| Example 1 | 15 | 0.375 | 0.1 | 0.0025 | ECT-7 | 0.7 | 0.0175 | — | — | — | — | — | — |
| Example 2 | 15 | 0.375 | 0.5 | 0.0125 | RLM-100 | 1.0 | 0.025 | — | — | — | — | — | — |
| Example 3 | 15 | 0.375 | 0.3 | 0.0075 | ECT-7 | 0.7 | 0.0175 | acetic acid | 2.0 | 0.05 | TMAH | 5.3 | 0.1325 |
| Example 4 | 15 | 0.375 | 0.5 | 0.0125 | ECT-7 | 10 | 0.25 | acetic acid | 2.0 | 0.05 | TMAH | 5.3 | 0.1325 |
| Comparative Example 1 | 15 | 0.375 | — | — | RLM-100 | 0.6 | 0.015 | — | — | — | — | — | — |
| Comparative Example 2 | 15 | 0.375 | 0.1 | 0.0025 | — | — | — | acetic acid | 2.0 | 0.05 | TMAH | 5.3 | 0.1325 |
| Comparative Example 3 | 15 | 0.375 | 0.5 | 0.0125 | — | — | — | acetic acid | 2.0 | 0.05 | TMAH | 5.3 | 0.1325 |
| Comparative Example 4 | 15 | 0.375 | 0.1 | 0.0025 | — | — | — | — | — | — | TDA-400-75 | 1.0 | 0.025 |
| Comparative Example 5 | 15 | 0.375 | 0.5 | 0.0125 | — | — | — | — | — | — | — | — | — |

TABLE 2

| | pH | Zeta potential (mV) | | Etching rate (nm/min) | | Roughness (nm) | | Contact angle (°) | | Solubility of Cu-BTA (mg/L) | |
|---|---|---|---|---|---|---|---|---|---|---|---|
| Example 1 | 2.4 | −51 | ○ | 0.02 | ○ | 1.553 | ○ | 24.5 | ○ | 846 | ○ |
| Example 2 | 2.4 | −40.5 | ○ | 0.018 | ○ | 1.384 | ○ | 37.4 | ○ | 404 | ○ |
| Example 3 | 3.3 | −46 | ○ | 0.011 | ○ | 1.627 | ○ | 29.4 | ○ | 588 | ○ |
| Example 4 | 3.3 | −24.1 | Δ | 0.012 | ○ | 1.534 | ○ | 26.0 | ○ | 662 | ○ |
| Comparative Example 1 | 2.3 | −14.5 | X | 0.011 | ○ | 1.66 | ○ | 34.3 | ○ | 515 | ○ |
| Comparative Example 2 | 3.3 | −10.6 | X | 0.03 | Δ | 1.744 | Δ | 55.5 | X | 404 | Δ |
| Comparative Example 3 | 3.2 | −47.5 | ○ | 0.034 | Δ | 1.762 | Δ | 40.2 | Δ | 368 | X |
| Comparative Example 4 | 2.4 | −25.9 | Δ | 0.083 | X | 5.603 | X | 51.4 | X | 478 | Δ |
| Comparative Example 5 | 2.3 | −19.6 | X | 0.097 | X | 3.916 | X | 54.4 | X | 184 | X |

The criteria used for evaluating zeta potential, etching rate, roughness measurement, contact angle measurement, and solubility of Cu-BTA in Table 2 are as follows.
(Zeta Potential)
 ○: below −40 mV
 Δ: −40 mV or higher but below −20 mV
 x: −20 mV or higher
(Etching Rate)
 ○: below 0.03 nm/min
 Δ: 0.03 nm/min or higher but below 0.05 nm/min
 x: 0.05 nm/min or higher
(Results of Roughness Measurement)
 ○: below 1.7 nm
 Δ: 1.7 nm or higher but below 3 nm
 x: 3 nm or higher
(Measured Contact Angle Value)
 ○: below 40 degrees
 Δ: 40 degrees or larger but below 50 degrees
 x: 50 degrees or larger
(Solubility of Cu-BTA)
 ○: 500 mg/L or higher
 Δ: 400 mg/L or higher but below 500 mg/L
 x: below 400 mg/L In Examples 1 to 3, in which the cleaning liquids contained citric acid as component (A), DBS as component (B), and a polyoxyethylene alkyl ether acetic acid (NIKKOL ECT-7, manufactured by Nikko Chemicals Co., Ltd., or AKYPO RLM-100, manufactured by Nikko Chemicals Co., Ltd.) as component (C), satisfactory results rated as 0 were obtained in all of the measurements of zeta potential, etching rate, roughness, contact angle and solubility of Cu-BTA.

In Example 4, the decrease in zeta potential was not so large because the mass ratio of component (B) and component (C) [component (B)/component (C)] was 0.02, although the cleaning liquid contains component (A), component (B) and component (C).

In Comparative Example 1, the cleaning liquid does not contain component (B). Because of this, no decrease in zeta potential occurred although satisfactory results were obtained in the measurements of etching rate, roughness, contact angle and solubility of Cu-BTA.

In Comparative Example 2, the cleaning liquid does not contain component (C). Because of this, not only a reduced etching rate was not obtained, but also satisfactory results were not obtained with respect to the other measurement items.

In Comparative Example 3, the measurement of zeta potential gave satisfactory results because the pH of the cleaning liquid diluted 40 times had been regulated to 3.2.

However, since the cleaning liquid does not contain component (C), satisfactory results were not obtained with respect to the other measurement items.

In Comparative Example 4, the cleaning liquid contains component (A) and component (B) but contains a carboxylic acid type nonionic surfactant (TDA-400-75) as component (C') in place of component (C). Although the component (C') is akin in chemical structure to the carboxylic acid type anionic surfactant as component (C), satisfactory results were not obtained with respect to the measurement items.

In Comparative Example 5, the cleaning liquid contains no ingredients other than component (A) and component (B), and satisfactory results were not obtained with respect to all measurement items.

The results given above show that by using the cleaning liquid of the invention, the zeta potential of colloidal silica can be considerably lowered without adversely affecting the Cu wiring and insulating film layer. It is apparent that the cleaning liquid has the effect of preventing fine particles from adhering again, without considerably corroding the Cu wiring. It is also apparent that since fine particles are prevented from adhering again, the semiconductor substrate which has been cleaned after a CMP step has a reduced amount of fine particles remaining thereon. Namely, it is apparent that the effect of highly cleaning a semiconductor substrate is produced by causing a considerable decrease in the zeta potential of colloidal silica without adversely affecting the Cu wiring and the insulating film layer.

While the invention has been described in detail and with reference to specific embodiments thereof, it will be apparent to one skilled in the art that various changes and modifications can be made therein without departing from the spirit and scope thereof. This application is based on a Japanese patent application filed on Aug. 31, 2010 (Application No. 2010-194429), the content thereof being incorporated herein by reference.

INDUSTRIAL APPLICABILITY

The cleaning liquid for semiconductor device substrates of the invention is capable of simultaneously removing the fine particles, organic contaminants, and metallic contaminants which are adherent to a semiconductor device substrate, without corroding the substrate surface, and has satisfactory water rinsability. Therefore, the invention is exceedingly useful industrially as a technique for cleaning contaminated semiconductor device substrates in steps for producing semiconductor devices, display devices, etc.

The invention claimed is:

1. A cleaning liquid, comprising components (A) to (D):
   (A) at least one of a polycarboxylic acid and a hydroxycarboxylic acid;
   (B) a sulfonic acid type anionic surfactant;
   (C) a carboxylic acid type anionic surfactant; and
   (D) water;
   wherein:
   component (C) is a compound of formula (1) or a salt thereof:

$$R-O-(AO)_m-(CH_2)_n-COOH \quad (1)$$

R is a linear or branched alkyl group having 5 to 20 carbon atoms;
   AO is at least one of an oxyethylene group and an oxypropylene group;
   m is 3 to 30; and
   n is 1 to 6.

2. The cleaning liquid according to claim 1, wherein component (A) is a compound that has two or more carboxyl groups and one or more hydroxy groups.

3. The cleaning liquid according to claim 1, wherein component (A) is a compound having 2 to 10 carbon atoms.

4. The cleaning liquid according to claim 1, wherein component (A) is at least one member selected from the group consisting of citric acid, tartaric acid, malic acid, and lactic acid.

5. The cleaning liquid according to claim 1, wherein component (B) is at least one member selected from the group consisting of an alkylsulfonic acid, a salt of an alkylsulfonic acid, an alkylbenzenesulfonic acid, a salt of an alkylbenzenesulfonic acid, an alkyldiphenyl ether disulfonic acid, a salt of an alkyldiphenyl ether disulfonic acid, an alkylmethyltauric acid, a salt of an alkylmethyltauric acid, a sulfosuccinic acid diester, and a salt of a sulfosuccinic acid diester.

6. The cleaning liquid according to claim 1, wherein:
   a content of component (A) is 5 to 30% by mass;
   a content of component (B) is 0.01 to 10% by mass; and
   a content of component (C) is 0.01 to 10% by mass.

7. The cleaning liquid according to claim 1, wherein:
   a content of component (A) is 0.03 to 3% by mass;
   a content of component (B) is 0.0001 to 1% by mass; and
   a content of component (C) is 0.0001 to 1% by mass.

8. The cleaning liquid according to claim 1, wherein a mass ratio of component (B) to component (C) [component (B)/component (C)] is in a range of 1/15 to 1.5/1.

9. The cleaning liquid according to claim 1, wherein, when colloidal silica having a primary-particle diameter of 80 nm is added to the cleaning liquid and the cleaning liquid is diluted to a water/cleaning liquid ratio of 40 by mass, the cleaning liquid has a zeta potential of −30 my or lower.

10. A method of cleaning a substrate for a semiconductor device, comprising:
    applying the cleaning liquid according to claim 1 to the substrate.

11. The method of cleaning a substrate for a semiconductor device according to claim 10, wherein:
    the substrate comprises Cu wiring and a low-dielectric constant insulating film on a substrate surface; and
    the substrate is a substrate that has been subjected to chemical mechanical polishing.

12. The cleaning liquid according to claim 1, wherein the compound of general formula (1) is a polyoxyethylene alkyl ether acetic acid.

* * * * *